United States Patent [19]

Hanak et al.

[11] Patent Number: 4,565,607

[45] Date of Patent: Jan. 21, 1986

[54] METHOD OF FABRICATING AN ELECTROPLATED SUBSTRATE

[75] Inventors: Joseph J. Hanak, Lawrenceville, N.J.; Prem Nath, Rochester, Mich.; Masatsugu Izu, Birmingham, Mich.; James Young, West Bloomfield, Mich.

[73] Assignee: Energy Conversion Devices, Inc., Troy, Mich.

[21] Appl. No.: 734,712

[22] Filed: May 16, 1985

Related U.S. Application Data

[62] Division of Ser. No. 588,013, Mar. 9, 1984, Pat. No. 4,530,739.

[51] Int. Cl.⁴ ............................................. C25D 5/48
[52] U.S. Cl. ............................. 204/38.1; 204/38.5; 204/38.7
[58] Field of Search .................... 204/4, 13, 38.5, 38.7, 204/38.1, 35.1

[56] References Cited

U.S. PATENT DOCUMENTS

| | | | |
|---|---|---|---|
| 1,704,247 | 3/1929 | Harrison | 204/13 |
| 2,433,441 | 12/1947 | Davidoff | 204/13 |
| 3,414,487 | 12/1968 | Helms | 204/13 |
| 3,463,719 | 8/1969 | Brown | 204/13 |
| 3,767,537 | 10/1973 | Selker | 204/13 |
| 4,053,370 | 10/1977 | Yamashita | 204/13 |
| 4,169,018 | 9/1979 | Berdan | 204/13 |

*Primary Examiner*—T. M. Tufariello
*Attorney, Agent, or Firm*—Marvin S. Siskind; Ronald W. Citkowski

[57] ABSTRACT

An electroplated substrate, characterized by a substantially reduced number of surface defects, for the fabrication of thin film electronic devices. The substrate is prepared in an electroforming process by electroplating onto and removing a metallic layer from the surface of a specifically prepared, substantially defect-free mandril. The substrate may be provided with a preselected surface finish by either (1) texturing the mandril or (2) controlling the parameters of the electroplating process to control the morphology of the deposit. The substrate is especially adapted for the fabrication of thin film photoresponsive devices which incorporate specular or diffuse back reflectors, since the texture may be controlled to provide for the appropriate type of reflectivity. Large area, thin film semiconductor devices incorporating the electroplated substrate are readily scribed to form electrically isolated small area segments for the fabrication of modules, arrays and the like.

17 Claims, 8 Drawing Figures

METHOD OF FABRICATING AN ELECTROPLATED SUBSTRATE

This is a divisional application Ser. No. 588,013 filed Mar. 9, 1984, now U.S. Pat. No. 4,530,739.

FIELD OF THE INVENTION

This invention relates generally to photoresponsive devices, and more particularly, to a method of fabricating substantially defect-free specular and diffuse back reflective substrates upon which thin film, semiconductor alloy layers may be subsequently deposited. The photoresponsive devices incorporating such substantially defect-free back reflective substrates are characterized by substantially reduced numbers of surface defects which may result in the formation of low resistance current paths, and substantially reduced numbers of nucleation centers about which nonhomogeneous semiconductor alloy material may be grown. The relatively thin, substantially defect-free substrate can be advantageously employed with a subjacent insulating support member to effect series, parallel or series-parallel electrical interconnections of the small area segments into which the photoresponsive devices are divided.

BACKGROUND OF THE INVENTION

By the method of fabricating improved back reflective substrates disclosed herein, photoresponsive devices may be manufactured. Such devices (1) exhibit increased operational reliability, (2) exhibit increased operational efficiency, (3) are fabricated in a manner resulting in increased yields, and (4) have a markedly reduced number of surface defects, thereby substantially reducing the number of (a) current-shunting paths and (b) nucleation centers which promote the nonhomogeneous growth of the subsequently deposited semiconductor material. The present invention has particular applicability to (1) large area, amorphous photovoltaic devices wherein the active semiconductor elements thereof are deposited onto a substrate electrode as relatively thin layers and are subsequently covered by a second electrode, and (2) the fabrication of such thin film, large area photovoltaic devices from amorphous semiconductor alloys. In accordance with the principles of the present invention, the method of fabrication is adapted to fabricate said substrate electrode with a greatly reduced number of surface defects so as to present a morphologically smooth and level substrate surface upon which homogeneous semiconductor material may be grown.

Single crystal photovoltaic devices, especially crystalline silicon photovoltaic devices have been utilized for some time as sources of electrical power because they are inherently non-polluting, silent and consume no expendable natural resources in their operation. However, the utility of such devices is limited by problems associated with the manufacture thereof. More particularly, single crystal materials (1) are difficult to produce in sizes substantially larger than several inches in diameter, (2) are thicker and heavier than their amorphous counterparts; and (3) are expensive and time consuming to fabricate.

Recently, considerable efforts have been made to develop systems for depositing amorphous semiconductor materials, each of which can encompass relatively large areas, and which can be doped to form p-type and n-type materials for the production of p-i-n type photovoltaic devices which are, in operation, substantially equivalent to their crystalline counterparts. It is to be noted that the term "amorphous", as used herein, includes all materials or alloys which have no long range order, although they may have short or intermediate range order or even contain, at times, crystalline inclusions.

It is now possible to prepare amorphous silicon alloys by glow discharge or vacuum deposition techniques, said alloys possessing (1) acceptable concentrations of localized defect states in the energy gaps thereof, and (2) high quality electrical and optical properties. Such deposition techniques are fully described in U.S. Pat. No. 4,226,898, entitled Amorphous Semiconductors Equivalent To Crystalline Semiconductors, issued to Stanford R. Ovshinsky and Arun Madan on Oct. 7, 1980; U.S. Pat. No. 4,217,374, of Stanford R. Ovshinsky and Masatsugu Izu, which issued on Aug. 12, 1980, also entitled Amorphous Semiconductors Equivalent To Crystalline Semiconductors; and U.S. patent application Ser. No. 423,424 of Stanford R. Ovshinsky, David D. Allred, Lee Walter, and Stephen J. Hudgens entitled Method Of Making Amorphous Semiconductor Alloys And Devices Using Microwave Energy. As disclosed in these patents and application, fluorine introduced into the amorphous silicon semiconductor layers operates to substantially reduce the density of the localized defect states therein and facilitates the addition of other alloying materials, such as germanium.

The concept of utilizing multiple cells, to enhance photovoltaic device efficiency, was described at least as early as 1955 by E. D. Jackson in U.S. Pat. No. 2,949,498 issued Aug. 16, 1960. The multiple cell structures therein discussed utilized p-n junction crystalline semiconductor devices. Essentially the concept employed different band gap devices to more efficiently collect various portions of the solar spectrum and to increase open circuit voltage (Voc). The tandem cell device (by definition) has two or more cells with the light directed serially through each cell. In the first cell a large band gap material absorbs only the short wavelength light, while in subsequent cells smaller band gap materials absorb the longer wavelengths of light which pass through the first cell. By substantially matching the generated currents from each cell, the overall open circuit voltage is the sum of the open circuit voltage of each cell, while the short circuit current thereof remains substantially constant. The multiple cells preferably include a back reflector for increasing the percentage of incident light reflected from the substrate back through the semiconductor layers of the cells. It should be obvious that the use of a back reflector, by increasing the use of light entering the cell, increases the operational efficiency of the multiple cells. Accordingly, it is important that any layer deposited atop the light incident surface of the substrate be transparent so as to pass a high percentage of incident light from the reflective surface of the back reflector through the semiconductor layers.

Unlike crystalline silicon which is limited to batch processing for the manufacture of solar cells, amorphous silicon alloys can be deposited in multiple layers over large area substrates to form solar cells in a high volume, continuous processing system. Such continuous processing systems are disclosed in U.S. Pat. No. 4,400,409, issued Aug. 23, 1983, for A Method Of Making P-Doped Silicon Films And Devices Made Therefrom; and pending U.S. patent applications: Ser. No.

244,386, filed Mar. 16, 1981, for Continuous Systems For Depositing Amorphous Semiconductor Material; Ser. No. 240,493, filed Mar. 16, 1981, for Continuous Amorphous Solar Cell Production System; Ser. No. 306,146, filed Sept. 28, 1981, for Multiple Chamber Deposition And Isolation System And Method; Ser. No. 359,825, filed Mar. 19, 1982, for Method And Apparatus For Continuously Producing Tandem Amorphous Photovoltaic Cells; and Ser. No. 460,629 filed Jan. 24, 1983 for Method and Apparatus For Continuously Producing Tandem Amorphous Photovoltaic Cells. As disclosed in these applications, a substrate may be continuously advanced through a succession of deposition chambers, wherein each chamber is dedicated to the deposition of a specific semiconductor material. In making a photovoltaic device of p-i-n type configurations, the first chamber is dedicated for depositing a p-type semiconductor alloy, the second chamber is dedicated for depositing an intrinsic amorphous semiconductor alloy, and the third chamber is dedicated for depositing an n-type semiconductor alloy. Since each deposited semiconductor alloy, and especially the intrinsic semiconductor alloy, must be of high purity; every possible precaution is taken to insure that the sanctity of the vacuum envelope formed by the various chambers of the deposition apparatus remains uncontaminated by impurities, regardless of origin.

The layers of semiconductor alloy material thus deposited in the vacuum envelope of the deposition apparatus may be utilized to form photoresponsive devices, such as, but not limited to photovoltaic cells which include one or more p-i-n cells or one or more n-i-p cells, Schottky barriers, photodiodes, phototransistors, or the like. Additionally, by making multiple passes through the succession of deposition chambers, or by providing an additional array of deposition chambers, multiple stacked cells of various configurations may be obtained.

As is obvious from the foregoing, thin film amorphous semiconductor materials offer several distinct advantages over crystalline materials, insofar as they can be easily and economically fabricated by newly developed mass production processes. However, in the fabrication of thin film semiconductor material by the aforementioned deposition processes, the presence of defects which cause low resistance current paths and nonhomogeneous growth of semiconductor material have been noted. The low resistance current paths and the nonhomogeneous growth have (1) seriously impaired the performance of the photoresponsive devices fabricated from the semiconductor material, and (2) detrimentally affected the production yields of that semiconductor material. The defects which give rise to low resistance current paths and nonhomogeneous growth were previously thought to either (1) be present in the morphology of the substrate electrode, or (2) develop during the deposition of the semiconductor layers. Commonly assigned U.S. patent application Ser. No. 518,184 filed May 28, 1983, entitled Barrier Layer For Photovoltaic Devices of P. Nath and M. Izu relates to one method of improving the performance of photoresponsive devices despite the presence of those defects which initiate current-shunting paths through the semiconductor material. Further, copending U.S. patent application Ser. No. 586,635, filed Mar. 5, 1984 of Prem Nath, Masatsugu Izu, Herbert Ovshinsky, Clifford Tennenhouse and James Young, and assigned to the assignee of the instant invention, defines the current shunting paths and the nonhomogeneous growth of semiconductor material to be due to the tens of thousands of surface defects which are present on the deposition surface of even high grade stainless steel. The solution proposed in said patent application was to electroplate a relatively thick (5-12 micron) nickel alloy levelling layer atop the deposition surface of the substrate so as to provide a substantially defect-free surface upon which to deposit the semiconductor material. However, while the aforementioned levelling layer effectively reduced the number of those substrate surface defects which give rise to current shunts and nonhomogeneous growth centers, the process is expensive, requires the deposition of a very thick layer atop the stainless steel or aluminum substrate, and still requires the deposition of a specular or diffuse reflective veneer thereupon. In contrast thereto, the instant invention relates to the fabrication of back reflective substrates for photosensitve devices, said substrates not only having a deposition surface characterized by a substantially reduced number of surface defects, but also by a reduced number of production steps and by a more economical process than heretofore possible.

Before proceeding with a description of the present invention, it is necessary to describe in greater detail the problems which the present invention is capable of solving. Accordingly, the paragraphs which follow first explain the difficulties caused by defects formed in the deposition surface of the substrate, and then detail the manner in which they have been solved. Dealing first with the problem of current-shunting defects, (and thereafter with the problem of nucleation defects), said defects may be characterized as "shunts", or "short-circuit" defects. In order to understand the operation thereof, it is important to note the thicknesses of the deposited semiconductor layers in a photoresponsive device such as a photovoltaic cell (also referred to as a solar cell). A typical p layer may be only on the order of 400 angstroms thick, a typical i layer may be only on the order of 3500 angstroms thick, and a typical n layer may be only on the order of 200 angstroms thick, thereby providing a total thickness of the semiconductor material for a single p-i-n photovoltaic cell of only about 4100 angstroms. It should therefore be appreciated that substrate defects, i.e., surface irregularities, however small, may not be readily covered by the thin film of deposited semiconductor material.

Current-shunting defects are present when one or more low resistance current paths develop between the electrodes of, for example, the solar cell. Under operating conditions, a solar cell in which a shunt has developed, exhibits either (1) a low power output, since electrical current collected at the electrodes thereof flows through the defect region (the path of least resistance) in preference to an external load, or (2) complete failure, where sufficient current is shunted through the defect region to "burn out" the cell.

Current-shunting defects or defect regions, the terms being interchangeably used herein, are not limited to "overt" or "patent" low resistance current paths. In some cases the adverse effects of a defect are latent and not immediately manifested. Latent defects can give rise to what will be referred to hereinafter as an "operational mode failure", wherein a photovoltaic device, initially exhibiting satisfactory electrical performance, suddenly fails. The failures will be referred to in this application as operational mode failures regardless of whether or not the device was previously connected to a load for the generation of power, it only being necessary that the device was, at some time, subjected to illumination, thereby initiating the generation of charge carriers. It has now been ascertained that the current-shunting defects, both latent and patent, arise from surface defects or irregularities in the morphology of the deposition surface of the substrate material, said defects being of a type which are either (1) not uniformly covered by or (2) cause nonhomogeneous growth of the subsequently deposited thin film layers of semiconductor material.

Despite the use of the highest quality stainless steel to serve as the substrate or base electrode upon which the semiconductor material is deposited, it has been estimated that from 10,000 to 100,000 surface defects (i.e., irregularities) per square centimeter are present on the deposition surface thereof. Such irregularities take the form of projections, craters, or other deviations from a smooth finish, and may be under a micron in (1) depth below the surface, (2) height above the surface, or (3) diameter. Depending upon their configuration, size, the sharpness with which the irregularities deviate from a smooth surface finish, and the manner in which the semiconductor material covers or fails to cover the defects, a low resistance current path through the semiconductor material may be established, thereby effectively short-circuiting the two electrodes of, for instance, the photovoltaic cell which has been fabricated therefrom. This may occur in numerous ways. For instance, a spike projecting from the surface of the substrate electrode may be of too great a height to be covered by the subsequent deposition of semiconductor material, and therefore, be in direct electrical contact with the second electrode when that second electrode is deposited atop the semiconductor material. Likewise, a crater formed in the surface of the substrate electrode may be of too large a diameter or too large a depth to be filled by the subsequent deposition of semiconductor material and therefore, be in sufficient proximity to the second electrode, when that second electrode is deposited atop the semiconductor material, for electrical current to either (1) bridge the gap which exists between the two electrodes, or (2) through actual use (the photo-induced generation of electrical current) of the photovoltaic device, cause the material of one of the electrodes to migrate toward and contact the other of the electrodes, and thereby pass electrical current therebetween. Note that even if the size of the defect (measured as its deviation from a smooth surface) is not very large, but it includes one or more sharp or jagged features, said defect is still capable of causing the deposited semiconductor material to be of less than optimum quality. This is because the sharp features of even small defects are (1) very difficult to uniformly cover by the subsequently deposited semiconductor material, and (2) capable of forming nucleation centers which promote nonhomogeneous growth of the subsequently deposited semiconductor material. Therefore, it is a first object of the instant invention to eliminate both defects which (1) due to the size thereof, cannot be adequately covered by the subsequently deposited semiconductor material, and defects which (2) due to the sharp features thereof, inhibit the deposition of homogeneous layers of semiconductor material.

The instant invention, as will be described in greater detail hereinbelow, provides for the fabrication of improved substrates specifically adapted for use in the fabrication of photoresponsive devices, said substrates being lightweight, relatively thin, easily and economically manufactured, and adapted to substantially eliminate the cause of low resistance current paths, both patent and latent, as well as to eliminate nonhomogeneous semiconductor growth caused by nucleation centers. More particularly, semiconductor devices produced in accordance with the principles outlined by the subject disclosure are characterized by improved production yields, improved electrical output and hence higher efficiencies, and a substantial reduction of substrate surface irregularities, said irregularities normally giving rise to current-shunting defects and/or nucleation centers.

According to a further feature of the preferred embodiment of the instant invention, the thin electroplated metallic substrate, which includes a substantially defect-free deposition surface upon which to subsequently deposit amorphous semiconductor alloy layers, may also be specifically tailored to provide back reflection of incident light.

The back reflective function can be inexpensively designed into the process for electroplating the substrate of the present invention without increasing the number of surface defects thereon. More particularly, in the manufacture of photoresponsive devices, the efficiency of the devices may be increased by forming back reflectors on the surface of the substrate upon which the amorphous semiconductor materials are subsequently deposited. These back reflectors may be either specular or diffuse. With either type of reflector, light which has initially passed through the active semiconductor region of the devices, but which is unabsorbed or unused on its initial pass, is redirected from the back surface of the device by the reflector to pass, once again, through those active semiconductor regions. The additional pass results in increased photon absorption and charge carrier generation in the active regions, thereby providing increased short circuit currents. In the case of specular back reflectors, the unused light is generally redirected for one or more additional passes through the active semiconductor regions of the device. And, in the case of diffuse back reflectors, the light is scattered in addition to being redirected through the active regions, thereby mandating that a portion of the redirected light travels at angles sufficient to cause it to be substantially confined within the device by internal reflection. In this manner, the devices sense and utilize the multiple reflections of the redirected light through the active semiconductor regions. As a result, both specular and diffuse back reflectors provide for increased short circuit currents and thus increased efficiencies of the photoresponsive devices with which they are employed. Another advantage of the diffuse reflector is that since the directed light passes through the active regions of the device at an angle, the active semiconductor regions can be made thinner than otherwise possible to reduce charge carrier recombination, while still maintaining efficient charge carrier generation and collection.

Heretofore, problems existed or great difficulty was experienced with the methods employed, in forming either specular or diffuse back reflectors on the deposition surfaces of substrates. In the case of specular reflectors, it was (prior to the instant invention) difficult to deposit a mirror-like layer of a reflective material, such as gold, silver, aluminum, copper, chromium or molybdenum, onto the substrate in a manner which would not subsequently peel. In the case of diffuse reflectors, a roughened texture was achieved by techniques such as sandblasting the substrate surface. However, such texturizing techniques resulted in the formation of morphological projections, craters and other uncontrollable defects. As previously stressed, due to the thinness of the deposited body of semiconductor material, the presence of defects of controlled size, gave rise to low resistance current paths and nucleation centers which rendered the photoresponsive device useless. The problems heretofore encountered in the production of diffuse and specular back reflectors are solved by the use of the electroplated substrate of the present application. Simply stated, it is now possible to electroplate a substrate characterized by a morphologically smooth, substantially defect-free, diffuse and/or specular back reflective surface upon which semiconductor alloy material can be deposited without developing low resistance current paths or centers of nucleation for the nonhomogeneous growth of semiconductor material.

Finally, the ultra-thin, substantially defect-free substrate of the instant invention offers significant advantages in the fabrication of electrically isolated, but electrically-interconnected small area segments from a large area photoresponsive device such as a photovoltaic cell. In order to better understand the advantages afforded by the substrate of the instant invention, the importance of dividing the large area cell into small area segments will first be explained.

As discussed hereinabove and detailed hereinafter, the effects of shorts and shunts may be mitigated or intensified, depending upon the current collection design of the large area device. More particularly, if a large area semiconductor body was designated to form a single, unsegmented large area photovoltaic cell, the presence of a single low resistance current path could disproportionately destroy the electrical output of the entire large area cell. Obviously, the probability of damaging the entire electrical output of a large area segmented photovoltaic cell is dependent upon the surface area of that large area cell, the number of small area segments into which it is divided, and the manner in which those small area segments are electrically connected. A large area cell may therefore include a plurality of electrically interconnected, small area photovoltaic segments, each capable of producing an electrical current in resonse to illumination, said small area segments cooperating to provide the total electrical output of the large area photovoltaic cell. The term "photovoltaic segment", as used herein, will refer to one of the small area subcells, or individual subunits into which the large area photovoltaic cell is divided.

If the small area segments into which the large area photovoltaic cell is subdivided are electrically connected in series, the voltages of the individual small area segments are added to produce the voltage of the large area photovoltaic cell. In such a series-connected arrangement of small area segments, an individual shorted or shunted segment will not necessarily destroy the operation of the entire large area cell since electrical current will merely flow through the low resistance current path to the next series connected small area segment. However, the utility of dividing a large area cell into a plurality of series connected small area segments is limited by the fact that the voltage is additive. The voltage of the series connected small area segments is dependent upon the number of functioning small area segments of the large area cell. If a large number of small area segments are inoperative, the sum of the voltages of the entire large area cell may be severely reduced. Furthermore, since the output voltage of a large area photovoltaic cell having series connected small area segments is dependent upon the number of operative small area segments, damage occurring after installation of the large area cell may also cause large scale voltage loss in that large area cell. In summary, a large area photovoltaic cell which is divided into a very large number of electrically series-interconnected small area segments will not have its output voltage changed significantly by the loss of a few segments; however such a device would exhibit a high output voltage and a low output current, and thereby be of limited utility.

The use of parallel connected small area segments is an alternative approach to the division of a large area photovoltaic cell into a plurality of small area segments, which connection will prevent a small number of defective portions thereof from destroying the electrical output of the entire cell. A parallel connected array of small area photovoltaic segments will provide a relatively high output current at a voltage equivalent to that of a single small area segment, i.e. the photogenerated currents of the plurality of small area segments are additive. The use of a parallel connected array of small area segments therefore offers the advantage of a high output current. However, a major problem exists with utilizing a parallel connected array of small area segments because a single shorted or shunted small area photovoltaic segment can effectively short circuit the entire large area photovoltaic cell by providing a low resistance current path in parallel with the small area segments.

A combined series-parallel array of small area photovoltaic segments has previously been employed to form a thin film, large area photovoltaic cell, thereby overcoming the problems previously discussed with reference to series connected and to parallel connected small area segments. According to known principles, a plurality of small area photovoltaic segments may be arrayed in a plurality of rows and columns upon a substrate. Tne small area photovoltaic segments within each given row are electrically connected in series so as to form a series connected row, and those series connected rows are then electrically connected in parallel, thereby forming the large area photovoltaic cell. It should be noted that the terms "rows" and "columns" as used herein, will designate subgroups of the small area segments within the matrix array of the small area segments which combine to form the large area photovoltaic cell. The term "rows" and "columns" as used herein include any grouping of adjacent small area segments, and accordingly may be used interchangeably; for example, the series connected segments, may be described as series connected rows or series connected columns. Furthermore, it is not necessary that the rows and columns be oriented at right angles to one another; other arrangements such as diagonal arrangements may be similarly employed. In summary, the series-parallel arrangement is defined to include groups of series connected photovoltaic small area segments, generally referred to herein as rows, which rows are then electrically connected in parallel.

It should thus be apparent that the output voltage of a series-parallel arrangement of the small area segments of a large area photovoltaic cell will be determined by the voltage produced in each series connected row, while the total output current will be determined by the sum of the current produced by each of the parallel connected rows. Thus as is also readily apparent, the electrical characteristics of a large area photovoltaic cell may be selected by choosing the appropriate series-parallel arrangement of the small area segments thereof.

The importance of such a series-parallel connected large area photovoltaic cell is that it is resistant to the effects of shorts, shunts, low resistance current paths and other mechanical damage to individual small area segments. For example, if an individual small area segment develops a current shunting type of defect, it will create a low resistance current path between the two adjacent small area segments with which it is electrically connected in series. Such current shunting defect will not short circuit current from the entire large area cell as would be the case if the small area segments were connected in parallel. Although the single defective small area segment will proportionally lower the output voltage of the row of small area segments with which it is connected in series, the effect of the single defective small area segment upon the total voltage output of the large area photovoltaic cell will be negligible since there are a plurality of rows of such series connected small area segments, the rows connected in parallel. Therefore, the fractional loss in electrical performance exhibited by the large area photovoltaic cell will be equal to the number of current shunting small area segments divided by the total number of small area segments into which the large area photovoltaic cell is divided. On the other hand, damage to a small area segment of the large area photovoltaic cell which results in a complete loss of the electrical output of that small area segment (i.e. an "open circuit" rather than a short circuit), destroys the electrical output of the entire row in which that small area segment is electrically connected in series, but does not (1) impair the electrical operation of the remaining rows of small area segments of the large area cell, or (2) lower the operating voltage of the large area cell. In contradistinction, a completely series connected array of small area segments, in which an open circuit condition exists, renders the large area photovoltaic cell inoperative. It should thus be apparent from the foregoing description that the utilization of a series-parallel arrangement of small area segments in the fabrication of large area photovoltaic cells is desirable. The importance of fabricating a large area photovoltaic cell divided into a series-parallel connected array of small area photovoltaic segments should now be apparent.

Through the use of the thin metallic electrodeposited material of the instant invention, which is subsequently affixed to an insulating support member, the etching process for dividing the large area cell into discrete, electrically-insulated small area segments is more easily and more economically effected. Further, in the prior art methods of forming series or series-parallel connected small area segments, the lower electrode required a metallization (by evaporation) step, which step is obviated by employing the present process. And as still another advantage, because the insulating support member of the instant invention is affixed to the electroplated deposit following the deposition of the semiconductor material, the most economical insulating material may be used. This is because outgassing at the elevated temperatures required for semiconductor deposition no longer imposes a limitation on the type of insulating support material employed. The instant invention thereby significantly reduces problems which have heretofore limited the efficient and widespread use of thin film, large area photovoltaic devices.

A final important advantage afforded by electroformed, substantially defect-free substrate, is its ability to provide an intermediate manufacturing product which has heretofore been unavailable. Specifically, by affixing an insulating support member to the surface of the substrate opposite the substantially defect-free surface thereof (following the deposition thereonto of the body of semiconductor material and the upper electrode), an intermediate photovoltaic-ready web can be fabricated at a first production facility. The photovoltaic-ready web can then either be stored for electrical and configurational modularization to meet customer specifications, or the web can be transported to the customer or another production facility for downstream modularization. In order to provide this intermediate product capability, it is necessary that the web of photovoltaic-ready material be able to form either series connections, parallel connections or series-parallel connections. And in order to form these various types of electrical connections, it is necessary that the photovoltaic material be provided with an insulating substrate (because a common conductive substrate could only be used to fabricate parallel connections). Obviously, the development of the thin, substantially defect-free substrate described herein, the insulating material had to be of the highest quality so as to prevent the outgassing thereof during the deposition of the semiconductor material. However, with the use of the present thin substrate, it is now possible to deposit the semiconductor material and the top electrode prior to affixing the insulating support member thereto. The thin substrate can now be easily scribed along with the superjacent semiconductor material and the top electrode to provide for series connected large area cells and small segments. Further, a low quality, and therefore inexpensive, insulating material can be used.

BRIEF SUMMARY OF THE INVENTION

There is disclosed herein an improved method of fabricating a substantially defect-free substrate which is adapted for the subsequent deposition thereonto of thin film photoresponsive material. The method includes the steps of providing a mandril, treating the mandril so as to form a substantially defect-free outer surface thereon, electroplating a metallic material onto the defect-free mandril surface and removing the metallic material from the mandril surface. In this manner, the substantially defect-free outer surface of the mandril is replicated by the electroplated metallic material. The metallic material may be continuously electroplated onto and continuously removed from the mandril surface. An electroplating bath, including the metallic material to be electroplated, is provided. The cylindrically-shaped mandril is operatively disposed so that only a portion of the circumferential periphery thereof enters and passes through the bath upon rotation of the mandril. In the preferred embodiment, the metallic material is a nickel alloy which is formed to a thickness of 0.2 to 4 mils, and a highly reflective coating may be deposited atop the surface of the electroplated material so that the substrate may function as a back reflector for a photoresponsive device. Additionally, the substantially defect-free outer surface of the mandril may either be textured or smooth so that the metallic material is adapted for use as either a diffuse or specular back reflector. A multi-function layer may be deposited atop the highly reflective coating for passivating the subjacent reflective coating and the subsequently deposited photoresponsive material and facilitating the adherence of subsequently deposited photoresponsive material to the reflective coating. Elements such as chromium, titanium, molybdenum and mixtures and alloys thereof are particularly well suited for this purpose.

There is also detailed herein a method of fabricating an improved photoresponsive device, said device including a body of a thin film semiconductor material deposited upon a substrate. The method includes the steps of providing a mandril, treating the mandril so as to provide a substantially defect-free outer surface thereon, electroplating a metallic substrate material onto the defect-free mandril surface, replicating the substantially defect-free outer surface of the mandril, removing the substrate material from the mandril surface and depositing a thin film body of semiconductor material atop the substantially defect-free surface of the substrate material. As mentioned above, the mandril is cylindrically-shaped and is positioned for rotational movement through the electroplating bath so that only a portion of the circumferential periphery thereof enters and passes through the bath upon rotation of the mandril. Also, as described above and detailed hereinafter, the metallic substrate material may be textured for purposes of forming a diffuse back reflector or finished to a smooth veneer for purposes of providing a specular back reflector. It is desirable to deposit a highly reflective coating atop the textured or veneered surface of the mandril, and it may further be necessary to deposit a multi-function layer atop the highly reflective coating for passivation and adherence purposes. In the preferred embodiment, the body of semiconductor material is deposited as at least one triad of p-i-n-type amorphous layers, following which a light transmissive electrode is formed atop the semiconductor material. Finally, an insulating support member may be affixed to the surface of the substrate material opposite the substantially defect-free surface thereof for providing electrical insulation in the sandwich direction and for rigidifying the device.

A third feature of the present invention involves a method of fabricating a large area semiconductor device, which is divided into a plurality of small area segments, each small area segment including a thin film body of semiconductor material deposited atop a substrate having a substantially defect-free surface. The method includes the sequential steps of providing a relatively thin metallic substrate characterized by a substantially defect-free deposition surface, depositing the thin film body of semiconductor material atop the substantially defect-free deposition surface of the substrate, affixing an insulating support member to the surface of the metallic substrate opposite the substantially defect-free surface thereof, and removing portions of the body of semiconductor material and the subjacent metallic substrate. In this manner, the large area semiconductor body is divided into a plurality of electrically discrete small area segments. The method preferably includes the further steps of depositing an electrode atop the semiconductor material, removing those portions of the electrode which correspond to the subjacent portions of the body of semiconductor material and the metallic substrate by either a single step or multiple step scribing process. The scribing techniques which could be employed include chemical etching, plasma etching, laser scribing, water jet scribing and combinations thereof. Once scribing of the electrode has been completed, the discrete small area segments of the large area device may be electrically connected. As with the embodiments of the invention described hereinabove, a textured or smooth veneer may be formed on the surface of the mandril from which the metallic substrate is formed, a highly reflective coating may be deposited upon the metallic substrate, and a multi-function layer may be deposited atop the highly reflective coating.

There still is additionally disclosed a method of fabricating a textured back reflective substrate for a photoresponsive device, the device including thin film layers of photoresponsive material. The method includes the steps of providing an electroplating bath which includes a source of metallic material, growing a columnar deposit to form a textured metallic surface upon the growth side of the deposit, and controlling the morphological growth of the columnar deposit so as to provide a substantially defect-free textured surface. In this manner, the textured surface of the metallic substrate is adapted to be used as a diffuse back reflector for a photoresponsive device. The morphological growth is controlled by maintaining preselected levels of current density and temperature for a given bath composition. The columnar deposit may be grown on a metallic support member such as a metallic plate, a web of substrate material, or upon a mandril having a metallic outer surface. As with the preceeding methods, the deposit may be continuously electroplated onto the mandril surface and continuously removed therefrom as the mandril rotates through the electroplating bath. It is also desirable to deposit a highly reflective coating atop the textured surface of the columnar deposit so that the reflective coating can function as a back reflector. Again, a multi-function layer is preferably deposited atop the reflective coating for purposes of passivation and facilitating an adherence of the subsequently deposited semiconductor alloy layers.

Finally, there is disclosed herein a method of providing photovoltaic modules which have been designed to meet preselected electrical and configuration specifications. The method includes the steps of (1) manufacturing photovoltaic-ready material by providing a metallic substrate having a deposition surface, depositing a body of semiconductor material atop the deposition surface of the substrate, depositing a top electrode upon the semiconductor body, and affixing an insulating support member to the surface of the substrate opposite the deposition surface thereof so as to provide intermediate photovoltaic-ready material by dividing the photovoltaic-ready material into large area photovoltaic cells, dividing the large area cells into small area segments, and electrically interconnecting the large area cells to form a module comprising a preselected number of electrically interconnected large area cells to form a module comprising a preselected number of electrically interconnected large area cells having a preselected arrangement of parallel-series, series and parallel connected small area segments. In order to effect the various electrical connections, the metallic substrate is either scribed with the top electrode and the semiconductor material (for series connections) or it is left intact (for parallel connections). In the preferred embodiment, the deposition is accomplished on an elongated web of the metallic substrate material, although discrete metallic substrate plates may also be used.

DETAILED DESCRIPTION OF THE DRAWINGS

I. THE PHOTOVOLTAIC CELL

Figure 1:
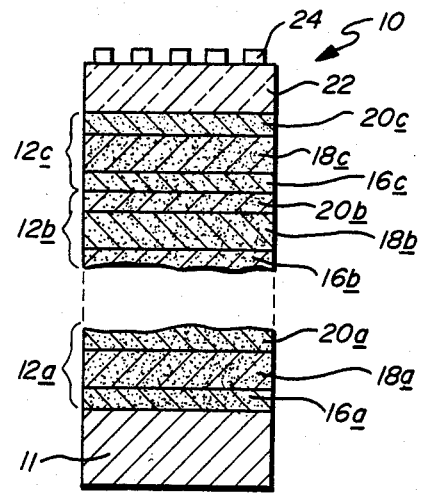
FIG. 1 is a fragmentary, cross-sectional view of a tandem photovoltaic device, said device comprising a plurality of p-i-n type cells, each layer of the cells formed from a semiconductor alloy.

Referring now to the drawings and particularly to FIG. 1, a photovoltaic cell formed of a plurality of successive p-i-n layers, each of which includes a semiconductor alloy, is shown generally by the reference numeral 10. The cell 10 includes the electroplated substrate of the instant invention, and is typical of the type of photoresponsive device in which the electroplated substrate of the instant invention may be advantageously employed. Accordingly, a detailed description of the cell 10 is necessary in order to better understand the function and advantages of said electroplated substrate.

More particularly, FIG. 1 shows a p-i-n type photovoltaic device such as a solar cell 10 made up of individual p-i-n type cells 12a, 12b and 12c. Below the lowermost cell 12a is the electroplated substrate 11 which functions as the bottom electrode of the cell 10. Although certain applications may require a thin oxide layer and/or a series of base contacts and/or a reflecting layer prior to the deposition of the semiconductor material, for purposes of this application, the term, "substrate" shall include not only the electroplated material of the instant invention but also any elements added thereto by preliminary processing.

Each of the cells, 12a, 12b and 12c are fabricated with an amorphous semiconductor body containing at least a silicon or germanium alloy. Each of the semiconductor bodies includes an n-type conductivity semiconductor layer 20a, 20b and 20c; an intrinsic semiconductor layer 18a, 18b and 18c; and a p-type conductivity semiconductor layer 16a, 16b and 16c. As illustrated, cell 12b is an intermediate cell and, as indicated in FIG. 1, additional intermediate cells may be stacked atop the illustrated cells without departing from the spirit or scope of the present invention.

It is to be understood that following the deposition of the semiconductor layers, a further deposition process may be either performed in a separate environment or as a part of a continuous process. In this step, a TCO (transparent conductive oxide) layer 22, formed in the preferred embodiment of indium tin oxide, also referred to herein as the top or upper electrode, is deposited atop the semiconductor material. An electrode grid 24 may be applied to the device where the cell is of a sufficiently large area, or if the conductivity of the TCO layer 22 is insufficient. The grid 24 shortens the carrier path through the TCO and thus increases the collection efficiency.

While the cell illustrated in FIG. 1 is a stacked assembly of p-i-n cells, the instant invention may also be employed with other cell arrangements such as single p-i-n cells, stacked or single n-i-p cells, p-n cells, Schottky barrier cells, as well as other thin film semiconductor devices. Accordingly, in the description and claims which follow, the layer or layers of semiconductor material disposed between the substrate 11 and the upper electrode 22 will be generally referred to as the "semiconductor body", or "body of semiconductor material", said terms intended to include combinations of semiconductor layers of various conductivities and materials which will provide for a flow of electrical current when appropriately combined with one or more electrodes and activated by illumination. This flow of electrical current is specifically defined to include the switching of current accomplished by photodiodes and phototransistors, as well as the generation of and collection of current accomplished by photovoltaic devices such as solar cells. Regardless of the ultimate device configuration, it is for the purpose of substantially reducing surface defects which promote the (1) flow of current through low resistance current paths between the substrate electrode and the top electrode, and (2) deposition of homogeneous semiconductor layers that the electroplated substrate 11 of the instant invention was developed.

Since the electroplated substrate 11 is produced in an electroforming process, which will be described in detail hereinbelow, and exhibits a substantially reduced number of surface defects compared to prior art substrate materials, said substrate is specifically adapted for the fabrication of thin film photoresponsive devices, such as photovoltaic cells.

II. THE DEFECTS AND DEFECT REGIONS

The surface defects may be manifested as (1) short circuit regions wherein low resistance current paths are formed between the upper electrode 22 and the substrate electrode 11 of a photovoltaic device 10, and (2) nucleating centers which promote the nonhomogeneous deposition of semiconductor material. These defects may also be latently manifested by sudden catastrophic failure under operating conditions of the photovoltaic device 10.

Figure 2:
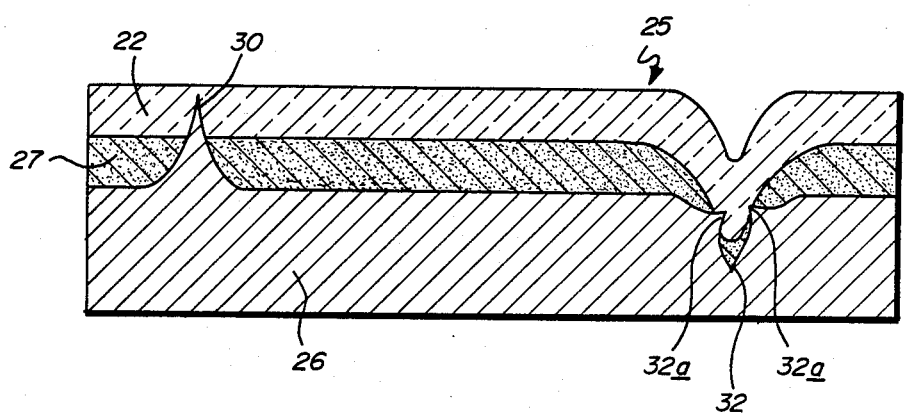
FIG. 2 is a cross-sectional view illustrating deleterious surface defects formed in the substrate of a semiconductor device which does not incorporate the electroplated, substantially defect-free substrate of the instant invention.

The formation and effect of said surface defects will be better understood by reference to FIG. 2 which generally illustrates a photovoltaic device 25 not provided with the defect-free substrate of the instant invention. The photovoltaic device 25 includes a defect containing substrate electrode 26, a body of semiconductor material 27, and a top electrode 22. A first defect region of the substrate electrode 26 is depicted by a raised protuberance or spike 30 associated with, and extending from the deposition surface thereof. This raised protuberance 30 may result from, inter alia, (1) metallurgical irregularities such as impurities, inclusions, growth irregularities, etc. in the material from which the substrate electrode 26 is formed, (2) mechanical damage due to nicks, abrasions, etc. occurring during handling of the substrate electrode 11, or (3) particles of dust or other particulate matter contaminating the surface of the substrate electrode 26 during handling, processing, etc. thereof. The protuberance 30 is of sufficient height so as to be either incompletely or inadequately covered by the subsequently deposited layers of semiconductor material 27, or forms a nucleation center which promotes the nonhomogeneous deposition of that semiconductor material. In this manner, a defect region is formed in the immediate vicinity of the protuberance 30. Obviously, where such defect regions occur in a semiconductor or photovoltaic device, either (1) a low resistance current path between the top transparent electrode 22 and the bottom substrate electrode 26 is established since the thickness, if any, of the semiconductor layers 27 separating the two electrodes is insufficient to prevent current from shunting therebetween, or (2) nonhomogeneous layers of semiconductor material are deposited, said layers being nonhomogeneous because the presence of defect regions serve as nucleation centers for the growth of semiconductor material.

A second illustrated defect region of the substrate electrode 11 is formed in the immediate vicinity of the crater, generally 32. As used herein, "craters" will be defined as depressions which include one or more sharp features, said depression formed in the deposition surface of the substrate electrode 26. If insufficient semiconductor material is deposited into the depressions, the top electrode 22 and the substrate electrode 26 will either (1) electrically approach one another, or (2) come into direct electrical contact with one another. Such craters 32, which may also be referred to as pin holes or pits, may be formed by (1) metallurgical or chemical irregularities in the surface of the substrate electrode 26, or (2) mechanical damage due to nicks, abrasions, etc. occurring during handling of the substrate electrode 26. Regardless of how the crater 32 originates, deposition of the upper electrode material (in the preferred embodiment, indium tin oxide) atop a portion of the body of semiconductor material 27 which, in turn, is deposited atop a crater 32 (including sharply defined features 32a thereof) formed in the substrate electrode 26, results in the formation of a low resistance current path between the upper electrode material 22 and the substrate electrode 26. In this manner, electrical current may be diverted from its normal path of travel through the body of semiconductor material 27 of the photovoltaic device 25. Further, the sharply defined features 32a of the craters 32 form nucleating centers about which nonhomogeneous semiconductor material may be subsequently grown.

The deposition surface of the substrate 26 includes defects which provoke short circuit current flow, promote nonhomogeneous semiconductor growth, and generally cause impaired performance of the photovoltaic devices of which they are an integral part. Further, under operating conditions, the electrical potential established between the top electrode 22 and the substrate electrode 26 will result in the flow of electrical current through the short circuit paths (the path of least resistance). Furthermore, if the short circuit current paths are either (1) of sufficient magnitude, or (2) of sufficient number, they can shunt a sufficient amount of current to render the entire photovoltaic device inoperative.

Referring now to the previously mentioned "operational mode failures", said failures are manifested by a sudden catastrophic inability of the photovoltaic device to function under normal operating conditions even though the device has effectively generated current for some period of time. Applicants now have found operational mode failures to be caused by a current or voltage driven reaction which exacerbates or intensifies latent defects existing in the photovoltaic device. Extremely high current densities are readily attained across defect sites having low resistivities. For example, a one micron square defect having a potential of one volt imposed thereacross could reach a current density of 100 Amperes/cm$^2$ (a current density which would destroy the device). Further, it is possible that under the influence of the electrical field developed between the top electrode 22 and the substrate electrode 26 when the photovoltaic device 25 is operatively employed to produce electrical energy from incident light energy, electrode material may migrate across a defect region such as a crater 32, a protuberance 30, or any sharply defined feature 32a. Since the defect region is incompletely filled in or covered up during the deposition of the semiconductor material, even very slight migration may be sufficient, over a period of time, to establish a low resistance current path therethrough, effectively short circuiting the device. Once such a low resistance current path is established, even under low intensity illumination, large amounts of current can readily flow therethrough and damage the overall operation of the photovoltaic device.

The electroplated substrate 11 of the instant invention, as described in the following section, is adapted to substantially prevent the formation of latent or patent defects which can cause low resistance current paths through the semiconductor material deposited thereupon. In particular, said electroplated, substantially defect-free substrate 11 drastically reduces the number of operational mode failures, while improving the room light yield of large area photovoltaic cells.

III. THE ELECTROPLATED SUBSTRATE

The substantially defect-free substrate material of the instant invention is prepared by an electroforming process. In the process of electroforming, which is well known to those skilled in the plating art, an electroplated deposit is formed upon an electrically conductive member called, in the present case, a mandril. When a predetermined thickness of the plated deposit is attained, the plating process is terminated, the plated deposit is removed from the mandril, and the member, thus produced, accurately replicates the contours of the mandril surface upon which it was formed. Electroforming has heretofore been employed for the fabrication of high quality parts such as dies, wave guides, etc., since it allows for the manufacture of complex shapes (albeit, heretofore relatively large sized shapes) with a high degree of accuracy.

According to the principles of the instant invention, the electroforming process has been adapted for the production of substantially defect-free metallic substrates having a pre-determined surface finish, said substrates particularly adapted for the fabrication of thin film semiconductor devices, and in particular, adapted for the fabrication of thin film amorphous photoresponsive devices. The method of the instant invention will be detailed with specific reference to FIG. 3, which illustrates one embodiment of an electroplating apparatus adapted for the continuous preparation of a relatively thin, metallic substrate.

An apparatus for the continuous preparation of a substantially defect free substrate is indicated generally by the reference numeral 32. Electroforming is basically an electroplating process, and accordingly, the apparatus 32 includes a plating tank 34 which contains an electroplating bath or solution 36, described in greater detail hereinbelow. The electroplating apparatus 32 further includes an elongated, generally cylindrically shaped mandril 38 upon which the electroplated deposit is formed. Accordingly, the mandril 38 must (1) have an electrically conductive deposition surface, (2) be resistant to corrosion by the plating bath 34, (3) be capable of maintaining a high quality surface finish, (4) be nonreactive with the electroplated material deposited thereupon, and (5) permit the electroplated deposit to be easily removed therefrom.

In the preferred embodiment, at least the outer surface of the mandril 38 is fabricated from titanium, because titanium (1) is an extremely durable metal, (2) may be provided with a high quality surface finish through standard metal finishing techniques, and (3) readily forms a passivating oxide which protects it from corrosion. Nickel is the preferred material from which to fabricate the substrate 11 of the instant invention, because nickel does not react with titanium and has a sufficiently different coefficient of thermal expansion to free the electroplated coating from the circumferential periphery of the mandril 38 by the application of heat or cold. Note that while titanium is described herein as the preferred mandril material, other metals such as stainless steel or aluminum may also be utilized to fabricate mandrils.

Figure 3:
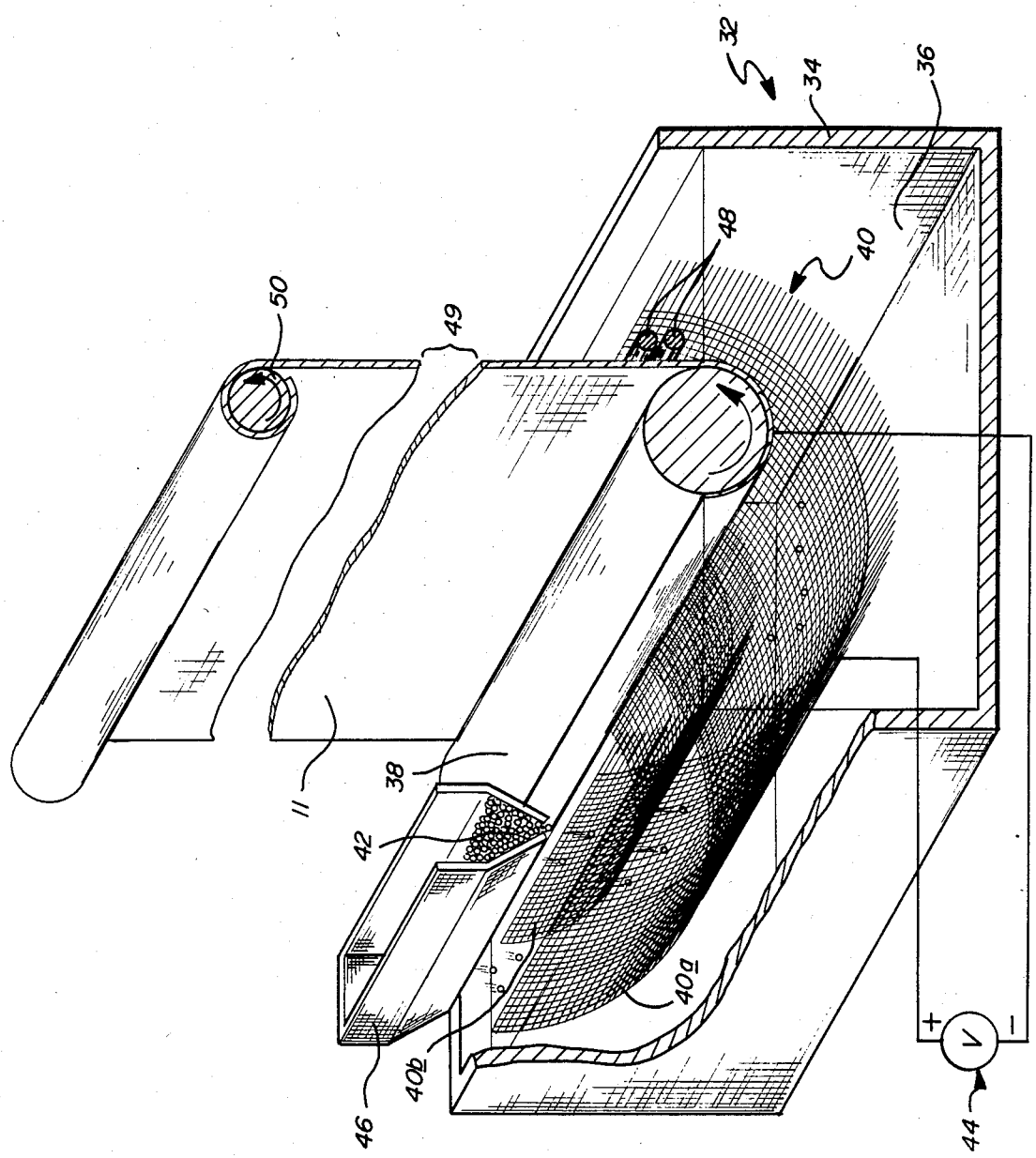
FIG. 3 is a perspective, partially sectionalized view illustrating an electroplating bath in which the web of substrate material of the instant invention, having a substantially defect-free deposition surface, is peeled off of a rotating mandril.

The electroplating apparatus 32 further includes a source of metallic plating material, typically a nickel alloy, from which the electroplated deposit is formed upon the surface of the mandril 38. As depicted in FIG. 3, the source of plating material comprises an anode basket 40 in which a supply of nickel alloy pellets 42 are provided. The anode basket 40, is (1) formed of a conductor, such as titanium, or any other metal which is inert to the plating solution 36, (2) adapted to maintain the nickel pellets 42 in relatively close proximity to, and at a relatively constant distance from the mandril 38, and (3) adapted to provide electrical contact to the nickel pellets 42. The anode basket 40 is generally perforated to form mesh-like openings which provide for the free flow of the electroplating bath 36 therethrough. Obviously the size of the perforations will be such that the nickel pellets 42 are retained within the basket 40.

The anode basket 40 is shown as a curved, dual walled structure, comprised of two walls 40a and 40b, formed of titanium mesh, adapted to maintain a supply of nickel pellets 42 in close proximity to the mandril 38; accordingly, the anode basket 40 is formed with a curvature that is generally concentric with the curvature of the mandril 38. For sake of clarity, the anode basket 40 is shown as having only a small number of nickel pellets 42 therein, although in operation the anode basket 40 is generally filled with pellets. Obviously, other configurations can be employed for the anode basket 40, in keeping with the principles of the instant invention. For example, the anode basket may be formed as a single walled curved member, and a supply of nickel pellets may be contained therein. Alternatively, a supply of nickel pellets may be introduced into the space between the plating tank 34 and the single walled anode basket, in which case the anode basket and the plating tank 34 will cooperate to maintain the nickel pellets in a spaced apart relationship from the mandril surface.

In accordance with established electroplating practices, a power supply 44 is utilized to maintain (1) the anode basket 40 and the nickel pellets 42 contained therein at a positive potential, and (2) the circumferential periphery of the mandril 38 at a negative potential sufficient to promote electroplating of the nickel onto the surface of the mandril 38 immersed in the plating bath 36.

Also included in the electroplating apparatus 32 is a supply hopper 46 for replenishing the nickel pellets 42 in the anode basket 40. In this manner, the electroplating process of the instant invention may be continuously operated. While in the preferred embodiment, the electroforming apparatus 32 further includes a heater 48 to assist in the removal of the electroplated deposit 11 from the mandril 38, it should be understood that cooling apparatus could also be employed.

Although not illustrated, a cleaning station may optionally be included for purposes of removing plating process residues from the electroplated substrate. The cleaning station; which, for example, may comprise a rinse bath and a drying station, may be positioned in line with the electroforming apparatus 32 so as to continuously clean the electroplated substrate 11 as it is produced. Such positioning of the cleaning station is indicated by the break 49 shown in the substrate 11. The apparatus may further include a take-up roller 50 for collecting and storing the prepared electroplated substrate 11.

Since electroformed materials are capable of accurately reproducing the circumferential periphery of the mandril upon which they are electroplated, it is possible to prepare substantially defect-free substrates by the method of the instant invention. Prior to initiating the process of electroplating substrates, the surface of the mandril 38 is treated so as to provide a substantially defect-free outer periphery. It is the object of this treatment process to remove any features which would give rise to the previously described surface defects. Accordingly, the mandril is provided with a very smooth, substantially defect-free surface by techniques which may include, by way of illustration, diamond machining, electro-polishing, buffing and the like. For example, a titanium mandril may be machined to a relatively high quality surface finish, electropolished to remove sharp features and then mechanically polished with progressively finer grits of abrasive culminating with 0.05 micron alumina powder. Since the electroplated material deposited upon the mandril will accurately replicate the mandril surface, painstaking mandril preparation will manifest itself in the truly reproduced surface quality of the substrate material 11 formed thereupon.

Operation of the electroplating apparatus 32 will be described with reference to the preparation of a substantially defect-free back reflective nickel substrate 11. The circumferential surface of the mandril 38 is first carefully prepared as previously described, and then operatively disposed such that a portion of the circumferential periphery thereof will rotatingly contact the plating bath. The anode basket 40 is filled with a charge of nickel pellets, electrical connection is established from the negative terminal of the power supply 44 to the mandril 38, electrical connection is established from the positive terminal to the anode basket 40, and the plating tank 34 is filled with a standard nickel sulfamate plating bath to a depth sufficent to cover approximately half of the circumferential periphery of the mandril 38. The plating bath is (1) an aqueous solution comprising of 400 grams per liter of nickel sulfamate, and 30 grams per liter of boric acid, and has a pH of 4.5, and (2) maintained at a temperature of approximately 60° C. The power supply 44 is energized to produce a voltage of approximately 12 volts and a current density of approximately 700 amps per square foot at the circumferential surface of the mandril 38. The mandril, which, in the preferred embodiment, is approximately 20 centimeters in diameter and approximately 40 centimeters in length, is rotated at a speed of approximately 2.5 rpm so as to have a portion of its circumferential surface continuously pass through the plating bath. Under these conditions, a coating of nickel, approximately 0.5 mils thick is deposited upon a portion of the circumferential surface of the mandril 38 as that surface rotates through the plating solution 36. Upon exiting the plating bath 36, the circumferential surface of the mandril is heated by a heating element 48 to assist in separation of the electroplated substrate material 11 therefrom. The substrate 11, thus produced, is cleaned and wound about the take-up reel 50 for storage or downstream processing, such as the deposition thereonto of thin film semiconductor material.

The electroplated, substantially defect-free substrate material, thus produced, exhibits a low density of harmful surface defects, thereby making the substrate an ideal candidate for the deposition of thin film semiconductor layers thereupon. When the device being fabricated is a photoresponsive device, it is frequently desirable to include a back reflector at the rear (i.e. distal from the light incident) surface for redirecting incident light that has passed through the active semiconductor layers unabsorbed back through those layers. While the surface of the electroplated nickel substrate provided by the electroforming process of the instant invention is highly reflective, it is frequently desirable to include an additional reflective layer thereatop to provide for efficient back reflection of said light. Such a reflective layer may be readily applied to the surface of the substrate 11 of the instant invention by any process well known in the art. For example, silver or copper may be electroplated onto the deposition surface of the nickel substrate subsequent to the electroforming thereof; likewise, aluminum, or various other alloys may be applied by (1) a vacuum deposition process such as an evaporation, or (2) a sputtering process. Among the preferred materials capable of providing efficient back reflection are silver, aluminum, copper, and alloys thereof with other elements such as silicon. It has been found that highly reflective, substantially defect-free surfaces can be formed from the deposition of 200 to 1000 angstroms of the aforementioned materials. Frequently, it is desirable to include a thin (20–50 angstroms) layer of a relatively inert, durable metal atop the reflective layer for (1) passivating the reflective surface from degradation by the ambient atmosphere or subsequent deposition conditions, and (2) promoting compatibility and adherence of the reflective layer with the subsequently deposited semiconductor layers. Molybdenum, chromium and titanium are examples of some metals which can be employed in the formation of this multifunction protective layer.

It should be apparent that back reflective layers may be deposited atop either specular or diffuse substrates. Specular back reflectors are characterized by a mirror-like reflection, and may be readily produced from the smoothly finished substrate which is obtained by the electroplating process described hereinabove. Likewise, diffuse back reflectors, which are characterized by the scattering of the incident light in addition to its reflection through the active semiconductor body, may be provided. The electroplating process of the instant invention may be used to fabricate a textured, back reflective, substantially defect-free surface which exhibits diffuse reflectivity, through the use of a textured mandril.

Figure 4:
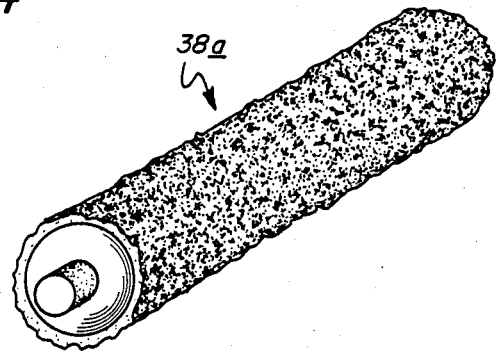
FIG. 4 is a perspective view of a second embodiment of the mandril illustrated in FIG. 3, said mandril having a textured, substantially defect-free circumferential surface.

Depicted in FIG. 4, is one such carefully textured mandril 38a. It should be noted that those defects of the substrate surface thereof which normally shunt current or promote nonhomogeneous growth, as discussed with reference to FIG. 2, should be distinguished from textured features. The former are generally sharp, irregular departures from a uniform, smooth surface, which cannot be adequately covered by subsequently deposited semiconductor layers or which serve to nucleate nonhomogeneous growth of that deposited semiconductor material. In contrast, the latter (textured features) are provided with smoothly varying deviations from the uniform, smooth surface which do not interfere with the uniform, homogeneous deposition of the subsequently deposited semiconductor layers. Rather, such textured features serve to increase the scattering of incident light, thereby increasing the absorption by the active semiconductor layers deposited thereupon.

The circumferential surface of the mandril 38a of FIG. 4 may be provided with a textured surface by processes such as machining, embossing, engraving, photomasking and etching, and the like. Note that in some cases it may be desirable to impose a surface texture directly upon the circumferential surface of the mandril 38, while in other cases a textured circumferential ring-like member may be prepared and affixed to the circumferential surface of the mandril 38.

While the foregoing description dealt with a continuous electroforming process for the production of electroplated substrate material, the instant invention is obviously not limited to such a process. Rather, the instant invention may also be practiced in a batch mode and may utilize noncylindrical mandrils. For example, a planar mandril may be electroplated to produce discrete sheets of planar substrate material; similarly, a belt-like mandril may be employed, to produce strips of substrate material.

In an alternative embodiment of the instant invention, a textured electroplated substrate may be formed without the use of a textured circumferential surface of the mandril. As is well known to those skilled in the plating art, the nature of the electroplated deposit will depend upon such parameters as, inter alia, bath composition, plating material composition (e.g. use of different materials to produce an alloy of desired morphology), current density and temperature. By controlling these parameters, an electroplated deposit exhibiting a preselected morphology upon the growth side thereof may be formed. In the apparatus 32 of FIG. 3 the growth side of the electroplated substrate material 11 will be that side of the substrate material which contacts the electroplating bath 36, vis-a-vis, the side of the substrate material which contacts the mandril 38. In this alternative embodiment, it is the growth side of the electroplated substrate material 11 which is optimized for the deposition of the semiconductor layers thereonto, and the mandril 38 merely serves as a support for the growth of the electroplated deposit. This alternative process offers the advantage that rigorous preparation of the circumferential mandril surface is not necessary since the surface morphology will depend upon the plating parameters. A textured surface which is also substantially defect-free may be readily achieved by promoting columnar growth of the nickel deposit. For example, use of the well known "Watts" plating process, in which a plating bath of nickel sulfate, nickel chloride and boric acid is employed, produces a columnar deposit having a matte finish and which may be used as a diffuse back reflector for photoresponsive devices.

IV. SUBDIVIDING LARGE AREA PHOTOVOLTAIC CELLS

Figure 5A:
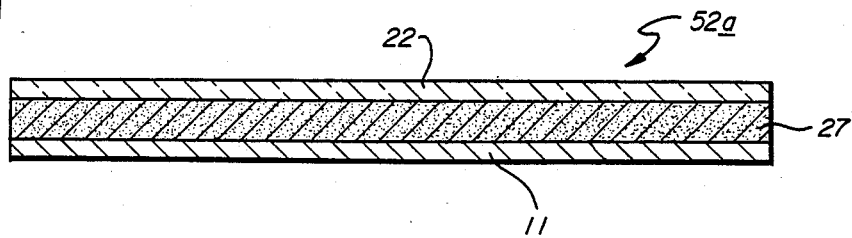
FIG. 5A is a cross-sectional view of a photoresponsive device in which the body of semiconductor material and the transparent conductive oxide are deposited on the substantially defect-free substrate surface of the instant invention.

In keeping with the principles of the instant invention, the substantially defect-free electroplated substrate of the instant invention may be utilized for the fabrication of large area semiconductor devices such as photoresponsive devices. The term "large area device" will refer to a semiconductor device of sufficiently large area that subdivision thereof is necessary in order to efficiently and practically use that device. For example, large area photovoltaic cells are subdivided into small area segments in order to more efficiently collect photogenerated current, to allow for electrical interconnection of the subdivided small area segments into preselected series and/or parallel connected arrays, or to obviate problems associated with defective segments thereof. FIG. 5A depicts a large area photovoltaic cell 52a including an electroplated substantially defect-free substrate layer 11 which is formed of a nickel alloy, in accordance with the principles set forth herein. Immediately atop the substrate layer 11 is deposited a semiconductor body 27, which may be formed by a plurality of the p-i-n layers depicted in FIG. 1, or by any other such photovoltaic body. Immediately atop and generally coextensive with the semiconductor body 27, the upper electrode 22, is deposited, which electrode 22 is preferably transparent and formed of a transparent conductive oxide (TCO) material, such as indium tin oxide.

While the large area photovoltaic cell 52 depicted in FIG. 5A is fully operative and ready for further processing, it is generally desirable to rigidify the cell 52 to facilitate handling and increase the durability thereof (note that the total thickness is only on the order of 2 mils). While the use of fairly thin (less than 2 mils thick) substrates results in savings of weight, and cost, and facilitates the subdivision of that large area photovoltaic cell into small area segments; such thin substrates provide neither sufficient rigidity nor dimensional stability to the cells formed thereupon to make the cells resistant to damage caused by sharp bending, wrinkling and abrasion which they will likely encounter during installation and use. Accordingly, a dimensionally stable insulating support member 54, depicted in FIG. 5B, may be advantageously affixed to the surface of the substrate opposite the surface upon which the deposition of semiconductor material occurs. The rigidified photovoltaic cell 52b, shown in FIG. 5B, exhibits improved resistance to damage occasioned during handling and use. The insulating support member 54 may be formed from a wide variety of materials, provided that these materials do not short circuit, react with, or otherwise degrade the semiconductor material which forms the photovoltaic cell 52b. Furthermore, the material from which the insulating support layer 54 is formed should have sufficient dielectric strength to resist an electric field of approximately 1000 volts imposed thereacross. Among some of the preferred materials for use in fabricating the insulating support member 54 are: glass, ceramics, synthetic polymers such as Mylar, Tedlar, and Kapton, as well as composite materials such as fiber glass-epoxy composites. Relatively thick, (greater than 8 mil) metallic sheets, having an insulating coating formed upon at least the substrate contacting surface thereof, may also be advantageously employed to form the insulating support member 54. The insulating support member 54 may be affixed to the surface of the substrate by conventional techniques well known in the art, such as by lamination, adhesive bonding and the like.

Figure 5B:
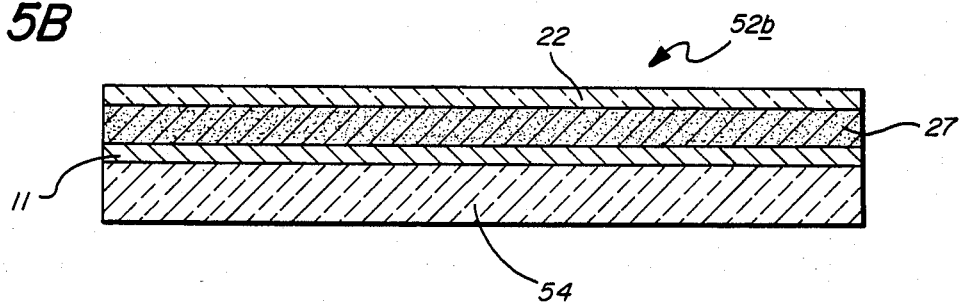
FIG. 5B is a cross-sectional view of the photoresponsive device of FIG. 5A, said device including an insulating support member.

Because of the thinness of the electroplated substrate 11 of the instant invention, a large area photoresponsive device, such as the large area photovoltaic cell 52b shown in FIG. 5B, may be readily subdivided into a plurality of small area segments. Such subdivision provides a plurality of discrete small area segments for special power generating applications, for simply improving the efficiency of current collection, or for providing a preselected array of electrically interconnected small area segments. More particularly, often it is desirable to form a parallel connected array of small area segments, while at other times it is desirable to form a series or mixed series-parallel array.

It is a notable feature of the instant invention that the insulating support backed large area cell 52b may be immediately subdivided in a subsequent series of processing steps, or it may be stored or shipped for later processing. In this manner, the cell 52b provides an inventory of photovoltaic-ready material which may be subsequently modularized according to desired electrical and configurational specifications by relatively simple scribing procedures. Thus, inventory may be kept to a minimum, while customer-specified device configurations may be readily provided. In any case, use of the electroplated substrate 11 of the instant invention makes the subdivision of a large area photoresponsive device, such as the photovoltiac cell 52a depicted in FIG. 5A, into a plurality of discrete segments, easy and economical.

Figure 5C:
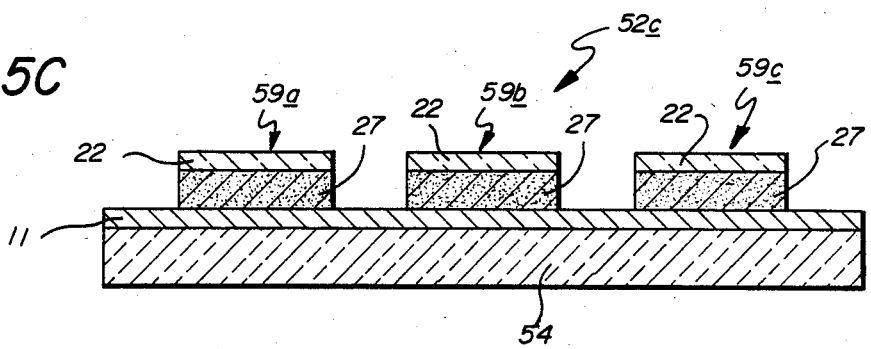
FIG. 5C is a cross-sectional view of the photoresponsive device of FIG. 5B in which the large area surface of the transparent conductive oxide and the semiconductor body have been etched to form small area segments.

Referring now to FIG. 5C, the large area photovoltaic cell is divided into a plurality of electrically isolated small area segments 59a, 59b, 59c which are disposed upon a common electrically conducting substrate 11. The substrate 11 is supported by an electrically insulating support member 54 as discussed hereinabove. The electrically isolated small area photovoltaic segments 59a–59c may be formed by any scribing process well known to those skilled in the art, such as chemical etching, laser scribing, water jet scribing, plasma etching and the like. It will be noted that the small area segments 59a–59c all share a common electrically conductive substrate layer, and may therefore be electrically connected into a parallel array by techniques such as those disclosed in U.S. Pat. No. 4,419,530 of Prem Nath, entitled IMPROVED SOLAR CELL AND METHOD FOR PRODUCING SAME, which is incorporated herein by reference.

Figure 5D:
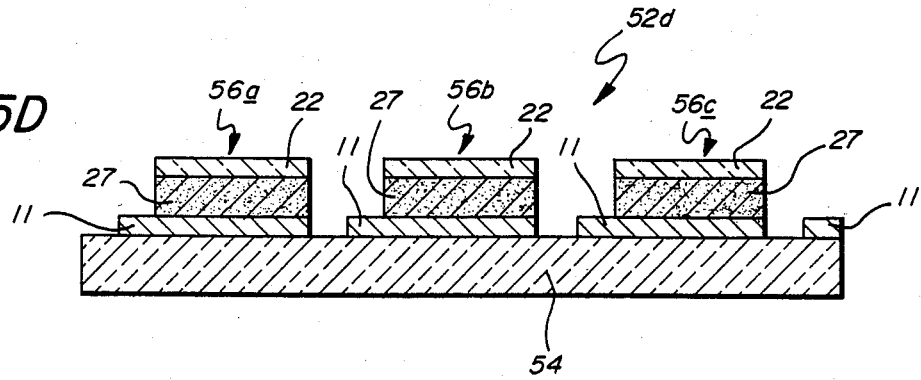
FIG. 5D is a cross-sectional view of the photoresponsive device of FIG. 5C in which the relatively thin, metallic, substantially defect-free substrate has been etched to substantially electrically isolate the adjacent small area segments thereof.

The portions of the electroplated substrate material between the scribed small area segments of the semiconductor material may be readily removed by processes such as the aforementioned chemical etching, laser scribing, plasma etching, or water jet scribing to electrically isolate the small area segments 56a, 56b, 56c as depicted as FIG. 5D. In the subdivided large area photovoltaic cell 52d shown in FIG. 5D, the electrically isolated small area segments 56a–56c are disposed upon the electrically insulating support member 54. The insulating support member 54 provides rigidity and dimensional stability of the array of small area segments while also providing horizontal electrical isolation between said adjacent small area segments. As should be apparent from FIG. 5D, the metallic material which forms the substrate 11 and the semiconductor material 27 have been scribed so as to expose portions of the substrate material between the electrically isolated small area segments 56a–56c. In this manner, electrical interconnection of the small area segments 56a–56c is facilitated. For example, by interconnecting the bottom metallic substrate layer 11 of a given small area segment (for example 56c) to the top electrode 22 of an adjacent small area segment (for example 56b) a series connection of the two adjacent small area segments may be established. Likewise electrical interconnection of the bottom substrate electrodes 11 of adjacent small area segments, and electrical interconnection of the top electrode 22 of those same small area segments establishes a parallel electrical interconnection. Obviously, a wide variety of series, parallel, or mixed series-parallel electrical interconnections may be established by utilizing an interconnect structure similar to that depicted in FIG. 5D. For example, a mixed series-parallel connected array may be readily established as the arrays disclosed in U.S. patent application Ser. No. 578,935 of Prem Nath filed Feb. 8, 1984 and entitled IMPROVED PHOTOVOLTAIC CELL AND METHOD FOR PRODUCING SAME, and in U.S. patent application Ser. No. 575,373 of Joseph Hanak, filed Jan. 30, 1984 and entitled IMPROVED LARGE AREA PHOTOVOLTAIC CELL AND METHOD FOR PRODUCING SAME, both of which applications are assigned to the assignee of the instant application, the disclosures of which are incorporated herein by reference.

As is apparent from the foregoing, the instant invention provides for the fabrication of high quality substrate material having a substantially defect-free surface which is particularly well adapted for the manufacture of thin film semiconductor devices thereupon. The substrate material is produced in a low cost, rapid process in which the texture of the surface may be readily controlled so as to provide for specular or diffuse light reflection from the substrate. Additionally, the thickness of the substrate may be controlled so as to facilitate the scribing thereof for the subdivision of large area semiconductor devices into small area segments. Accordingly, the instant invention has great utility in the manufacture of thin film semiconductor devices.

While the foregoing description has been primarily oriented toward the fabrication of photoresponsive devices in general, the instant invention is obviously not so limited, but may be readily and advantageously employed in the fabrication of any thin film semiconductor device requiring a substantially defect-free substrate. The instant invention has utility in the fabrication of memory arrays, integrated circuits, photodetectors, as well as any other electronic device formed of thin film layers of semiconductor material, be those layers crystalline, polycrystalline, microcrystalline or amorphous.

The foregoing description and example are merely illustrative of the utility of the instant invention, and are not intended as limitations thereon. It is the claims which follow, and including all equivalents, which define the scope of the invention.

What is claimed is:

1. A method of fabricating a large area semiconductor device, said device divided into a plurality of small area segments; each small area segment including a thin film body of semiconductor material and a substrate having a substantially defect-free surface; said method including the steps of:

electroplating, from a mandril, a relatively thin metallic substrate characterized by a substantially defect free deposition surface having features which (1) provide for the reflection of light and (2) do not substantially interfere with the subsequent deposition of the uniform and homogeneous thin film body of semiconductor material thereupon, depositing the thin film body of semiconductor material atop the substantially defect free deposition surface of the substrate;

removing portions of the (1) body of semiconductor material and/or (2) subjacent metallic substrate; and securing an insulating support member to the surface of the metallic substrate opposite the substantially defect-free deposition surface thereof, whereby the large area semiconductor device is divided into a plurality of electrically discrete small area segments.

2. A method as in claim 1, including the further steps of: depositing an electrode atop the body of semiconductor material; and removing those portions of the electrode which correspond to the subjacent portions of the body of semiconductor material and metallic substrate.

3. A method as in claim 2, including the further step of removing the portions of the (1) electrode, (2) body of semiconductor material, and (3) metallic substrate in a single step scribing process.

4. A method as in claim 3, wherein the scribing process is selected essentially from the group of removal techniques including: chemical etching; plasma etching; laser scribing; water jet scribing; and combinations thereof.

5. A method as in claim 3, including the further step of removing the portions of the (1) electrode, (2) body of semiconductor material, and (3) metallic substrate in a multi-step scribing process.

6. A method as in claim 5, wherein the multi-step scribing process is selected essentially from the group of removal techniques including: chemical etching; plasma etching; laser scribing; water jet scribing; and combinations thereof.

7. A method as in claim 1, including the further step of electrically connecting the discrete small area segments of the large area device.

8. A method as in claim 1, including the further step of forming the metallic substrate to additionally provide a light reflective function.

9. A method as in claim 8, including the further step of depositing a multi-function layer atop the highly reflective coating, said multi-function layer adapted to (1) passivate the subjacent reflective coating and the subsequently deposited semiconductor material, and (2) facilitate adherence of the subsequently deposited semiconductor material to the reflective coating.

10. A method as in claim 8, including the further step of texturing the substantially defect-free deposition surface of the substrate, whereby the textured substrate provides a diffuse back reflector.

11. A method as in claim 8, including the further step of forming the substantially defect-free deposition surface of the substrate as a smooth veneer, whereby the smooth substrate provides specular back reflector.

12. A method as in claim 1, including the further step of depositing the body of semiconductor material as at least one triad of p-i-n type layers.

13. A method as in claim 1, including the further step of forming the insulating support member from at least a single layer of a synthetic plastic resin.

14. A method as in claim 13, including the further step of forming the insulating support member as a dual layered structure comprising: the synthetic plastic resin layer in contact with the substrate material, and the opposite surface of which has secured thereto a rigidifying member.

15. A method as in claim 1, wherein the electroplating process includes the further steps of:
providing a mandril;
treating the mandril so as to provide a substantially defect-free outer surface thereon;
electroplating a metallic substrate material onto the defect-free mandril surface; and
removing the substrate material from the mandril surface for replicating the substantially defect-free outer surface of the mandril.

16. A method as in claim 1, wherein said metallic substrate is formed of a nickel alloy.

17. A method as in claim 16, including the further step of providing a 0.2 to 4 mil thick metallic substrate.

* * * * *